(12) United States Patent
Pribat et al.

(10) Patent No.: US 8,138,046 B2
(45) Date of Patent: Mar. 20, 2012

(54) PROCESS FOR FABRICATING A NANOWIRE-BASED VERTICAL TRANSISTOR STRUCTURE

(75) Inventors: Didier Pribat, Sevres (FR); Costel-Sorin Cojocaru, Palaiseau (FR)

(73) Assignee: Ecole Polytechnique (FR)

( * ) Notice: Subject to any disclaimer, the term of this patent is extended or adjusted under 35 U.S.C. 154(b) by 134 days.

(21) Appl. No.: 12/278,173

(22) PCT Filed: Feb. 5, 2007

(86) PCT No.: PCT/EP2007/051076
§ 371 (c)(1),
(2), (4) Date: Aug. 4, 2008

(87) PCT Pub. No.: WO2007/090814
PCT Pub. Date: Aug. 16, 2007

(65) Prior Publication Data
US 2009/0035908 A1  Feb. 5, 2009

(30) Foreign Application Priority Data
Feb. 7, 2006  (FR) .................................... 06 01074

(51) Int. Cl.
*H01L 21/336* (2006.01)
(52) U.S. Cl. ................. 438/268; 438/283; 257/E21.291
(58) Field of Classification Search ............... 438/283, 438/284, 156–157, 268–269; 257/E21.291
See application file for complete search history.

(56) References Cited

U.S. PATENT DOCUMENTS

| 6,197,641 B1 * | 3/2001 | Hergenrother et al. ....... 438/268 |
| 7,214,553 B2 | 5/2007 | Legagneux et al. |
| 2001/0023986 A1 | 9/2001 | Mancevski |
| 2002/0172820 A1 | 11/2002 | Majumdar et al. |

(Continued)

FOREIGN PATENT DOCUMENTS

WO  WO2005064664  7/2005

(Continued)

OTHER PUBLICATIONS

U.S. Appl. No. 11/916,161, filed Nov. 30, 2007, Paolo Baondavalli et al. (Not Yet Published).

(Continued)

*Primary Examiner* — Matthew Landau
*Assistant Examiner* — Daniel Luke
(74) *Attorney, Agent, or Firm* — Lowe Hauptman Ham & Berner, LLP

(57) ABSTRACT

The invention relates to a process for fabricating a vertical transistor structure. On a substrate (10), is a first conductive layer (11), providing the source or drain electrode function, and an upper conductive layer (17), providing the drain or source electrode function. The production of a membrane includes a stack of porous layers including a first insulating layer (20), a second conductive layer (12), providing the gate electrode function, and an upper insulating layer (13') on the surface of the substrate covered with the first conductive layer (11) providing the drain or source electrode function. The porous layers having substantially stacked pores. The production of filaments made of a semiconductor material is inside some of the stacked pores of the porous layers. The production of the upper conductive layer provides the source or drain electrode function on the surface of the stack of porous layers filled with filaments made of semiconductor material.

19 Claims, 6 Drawing Sheets

U.S. PATENT DOCUMENTS

| | | | |
|---|---|---|---|
| 2003/0010971 A1* | 1/2003 | Zhang et al. | 257/15 |
| 2004/0097040 A1 | 5/2004 | Kamins | |
| 2005/0029654 A1* | 2/2005 | Mio et al. | 257/734 |
| 2005/0062033 A1 | 3/2005 | Ichihara et al. | |
| 2005/0224888 A1* | 10/2005 | Graham et al. | 257/368 |
| 2005/0235906 A1 | 10/2005 | Legagneux et al. | |
| 2005/0276093 A1* | 12/2005 | Graham et al. | 365/149 |

FOREIGN PATENT DOCUMENTS

WO     WO2005071754     8/2005

OTHER PUBLICATIONS

Lew K-K et al. "Growth Characteristics of Silicon Nanowires Synthesized by Vapor-Liquid-Solid Growth in Nanoporous Alumina Templates." Journal of Crystal Growth, Elsevier, Amsterdam, NL, vol. 254, No. 1-2, Jun. 2003, pp. 14-22, XP004424628, ISSN: 0022-0248.

Cui, Y. and C. M. Lieber, Functional Nanoscale Electronic Devices Assembled Using Silicon Nanowire Building Blocks, Science, vol. 291, pp. 851-853, Feb. 2, 2001.

Duan, X., et al., "High-Performance Thin-Film Transistors Using Semiconductor Nanowires and Nanoribbons", Nature, vol. 425, pp. 274-277, Sep. 18, 2003.

Cui, Y. et al., High Performance Silicon Nanowire Field Effect Transistors, Nano Letters, vol. 3, No. 2, pp. 149-152, 2003.

Samuelson et al., "Semiconductor Nanowires for Novel One-Dimensional Devices", Physica E 21, pp. 560-567, 2004.

Bakkers, E. et al., "Epitaxial Growth of InP Nanowires on Germanium", Nature Materials, vol. 3, pp. 769-773, Nov. 2004.

Avouris, Phaedon, "Molecular Electronics with Carbon Nanotubes", Accounts of Chemical Research, vol. 35, No. 12, pp. 1026-1034, 2002.

Javey, A., et al., "Ballistic Carbon Nanotube Field-Effect Transistors", Nature, vol. 424, pp. 654-657, Aug. 7, 2003.

Javey, A., et al., "High-k Dielectrics for Advanced Carbon-Nanotube Transistors and Logic Gates", Nature Materials, vol. 1, pp. 241-246, Dec. 2002.

Javey, A., et al., "Carbon Nanotube Field-Effect Transistors with Integrated Ohmic Contacts and High-k Gate Dielectrics", Nano Letters, vol. 4, No. 3, pp. 447-450, 2004.

Siedel, R. V., et al., "Sub-20 nm Short Channel Carbon Nanotube Transistors", Nano Letters, vol. 5, No. 1, pp. 147-150, 2005.

Misewich, J. A., et al., "Electrically Induced Optical Emission From a Carbon Nanotube FET", Science, vol. 300, pp. 783-786, May 2, 2003.

Hazani, M. et al., "DNA-Mediated Self-Assembly of Carbon Nanotube-Based Electronic Devices", Chemical Physics Letters, vol. 391, pp. 389-392, 2004.

Jin, Song et al., "Scalable Interconnection and Integration of Nanowire Devices Without Registration", Nano Letters, vol. 4, No. 5, pp. 915-919, 2004.

Lew, K. K. and J. M. Redwing, "Growth Characteristics of Silicon Nanowires Synthesized by Vapor-Liquid-Solid Growth in Nanoporous Alumina Templates", Journal of Crystal Growth, vol. 254, pp. 14-22, 2003.

Wagner, R. S., Whisker Technology, VLS Mechanism of Crystal Growth, pp. 47-119, 1970.

Cui, Y., et al., "Diameter-Controlled Synthesis of Single-Crystal Silicon Nanowires", Applied Physics Letters, vol. 78, pp. 2214-2217, 2001.

O'Sullivan, J. P. and G. C. Wood, "The Morphology and Mechanism of Formation of Porous Anodic Films on Aluminum", Proc. Roy. Soc. Lond., vol. A317, pp. 511-543, 1970.

Masuda, H. and K. Fukuda, "Ordered Metal Nanohole Arrays made by a Two-Step Replication of Honeycomb Structures of Anodic Alumina", Science, vol. 268, pp. 1466-1468, Jun. 9, 1995.

* cited by examiner

PROCESS FOR FABRICATING A NANOWIRE-BASED VERTICAL TRANSISTOR STRUCTURE

CROSS-REFERENCE TO RELATED APPLICATIONS

The present Application is based on International Application No. PCT/EP2007/051076, filed on Feb. 5, 2007, which in turn corresponds to Application No. 0601074, filed on Feb. 7, 2006, and priority is hereby claimed under 35 USC §119 based on these applications. Each of these applications are hereby incorporated by reference in their entirety into the present application.

FIELD OF THE INVENTION

The invention relates to the field of electronic components and more particularly to the field of transistors based on nanowires of semiconductor materials (Si, Ge, GaAs, etc.) or else based on semiconducting carbon nanotubes. The invention may be notably applied to the production of transistors for integrated circuits or to the production of transistors for active matrices for driving flat liquid-crystal display screens. The invention may also be applied to the production of transistors for active matrices for driving display screens based on organic light-emitting diodes (OLEDs, PLEDs, etc.).

BACKGROUND OF THE INVENTION

In recent years, many electronic and optoelectronic components have been produced that are either based on semiconductor nanowires (Y. Cui and C. M. Lieber, Science, Vol. 291, p. 851, 2001; X. Duan and C. Niu et al., Nature, Vol. 425, p. 274, 2003; Y. Cui et al., Nano Lett. Vol. 3, p. 149, 2003; Samuelson et al., Physica E 21, p. 560, 2004; E. Bakkers et al., Nature Materials, Vol. 3, p. 769, 2004) or based on carbon nanotubes (Ph. Avouris, Accounts of Chemical Research, Vol. 35, p. 1026, 2002; A. Javey et al., Nature, Vol. 424, p. 654, 2003; A. Javey et al., Nature Materials, Vol. 1, p. 241, 2002; A. Javey et al., Nano Lett., Vol. 4, p. 447, 2004; R. V. Siedel et al., Nano Lett., Vol. 5, p. 147, 2005; J. A. Misewich et al., Science, Vol. 300, p. 783, 2003) and the benefit of such nanostructures has been widely demonstrated. In particular, with regard to silicon nanowires, carrier (hole) mobilities of around 1300 cm2/Vs have been obtained (Y. Cui et al., Nano Lett., Vol. 3, p. 149, 2003), which is quite remarkable, whereas with regard to semiconducting carbon nanotubes (also called s-CNTs) mobilities of around 3000 cm2/Vs (again for holes) have been published (A. Javey et al., Nature Materials, Vol. 1, p. 241, 2002; A. Javey et al., Nano Lett., Vol. 4, p. 447, 2004). Recently, light-emitting diodes based on s-CNTs have been produced (J. A. Misewich et al., Science, Vol. 300, p. 783; 2003).

However, although the benefit of devices based on nanostructures is incontestable, their fabrication on a large scale and their integration into complex circuits is impossible at the present time, since no recognized method exists for handling and organizing a large number of nanowires and/or s-CNTs reliably and reproducibly.

Various techniques have been proposed for collectively organizing nanowires/s-CNTs on a surface. These techniques are based either on chemical grafting of the surface and/or of the nanowire (M. Hazani et al., Chemical Physics Letters, Vol. 391, pp. 389-392, 2004) or on the use of Longmuir-Blodgett-type layers (Song Jin et al. Nano Letters, Vol. 4, pp. 915-919, 2004) or on growth in porous alumina templates (K. K. Lew and J. M. Redwing, Journal of Crystal Growth, Vol. 254, pp. 14-22, 2003). According to this technique, a membrane 2 is produced by anodic oxidation of an aluminum substrate 1. Next, metallic catalytic elements 3$i$ of the gold type are deposited as illustrated in FIG. 1. Starting from these catalytic elements, single crystals 4$i$ of semiconductor material are grown from the vapor phase, thanks for example to a stream of silane, Fv, using the known VLS (vapor-liquid-solid) method. The growth of single crystals using this method was very widely studied during the 1960s ("Whisker Technology" by R. S. Wagner, Wiley, pp. 47-119, 1970). The principle of this method is illustrated in FIG. 2.

More precisely, a spot of gold is placed on the surface of a substrate and the assembly is heated to 400° C. in the presence of silane gas SiH4. The latter will slightly decompose and the silicon (Si) atoms liberated will alloy with the gold (Au) on the surface so as to form the alloy element 3'$i$. According to the gold/silicon phase diagram illustrated in FIG. 3, the composition of the alloy will vary toward the eutectic composition as the gold is progressively enriched with silicon and there will be surface melting as soon as the liquidus drops below 400° C. The surface of the liquid, having adsorption sites that are unsaturable, thus becomes a place for preferential decomposition of the SiH4 molecules. As a result, the entire gold spot will rapidly reach the eutectic composition and melt. The composition of the liquid will continue to change beyond the eutectic composition, where the liquidus goes back above 400° C. Excess silicon is therefore expelled at the liquid/solid interface, so as to maintain the thermodynamic equilibrium, and the drop of eutectic liquid progressively rises on the expelled crystal, taking the form of a whisker with a diameter equal to that of the drop, allowing the subsequent growth of the silicon nanowire 4$i$.

This technique, extensively developed in the 1960s, was recently used for growing silicon nanowires from gold nanoparticles deposited beforehand on a substrate (Y. Cui et al., Applied Physics Letters, Vol. 78, pp. 2214-2217, 2001). Nanowires with a diameter between 10 and 20 nm may be routinely fabricated using this method. Moreover, field-effect transistors produced from such nanowires exhibit remarkable transport properties—hole (p) mobilities that may be up to 1300 cm2/Vs having been measured (Y. Cui et al., Nano Letters, Vol. 3, pp. 149-152, 2003).

SUMMARY OF THE INVENTION

The present invention proposes to use this vapor crystal growth technology via a porous membrane in order to produce a novel vertical transistor structure having very small dimensions and for this purpose to produce a membrane which is heterogeneous in terms of thickness, for integrating a gate electrode.

More precisely, the subject of the invention is a process for fabricating a vertical transistor structure comprising on a substrate, a first conductive layer, providing the source or drain electrode function, and an upper conductive layer, providing the drain or source electrode function, characterized in that it comprises the following steps:

the production of a membrane consisting of a stack of porous layers that includes at least a first insulating layer, a second conductive layer, providing the gate electrode function, and an upper insulating layer on the surface of the substrate covered with the first conductive layer providing the drain or source electrode function, said porous layers having substantially stacked pores;

the production of filaments made of semiconductor material inside at least some of the stacked pores of the porous layers; and the production of the upper conductive layer providing the source or drain electrode function on the surface of the stack of porous layers filled with filaments made of semiconductor material.

In one embodiment, the filaments are made of silicon or germanium or III-V material of the GaAs type.

In one embodiment, the filaments of semiconductor material have heterogeneous regions along their height.

According to one embodiment, the filaments have a region made of n-doped or p-doped semiconductor material, a region made of intrinsic semiconductor material and a region made of p-doped or n-doped semiconductor material.

In one embodiment, the filaments have regions made of different semiconductor materials.

In one embodiment, the filaments are made of carbon.

Advantageously, the upper insulating layer is made of porous alumina.

Advantageously, the first insulating layer is made of silica.

In one embodiment of the invention, the filaments in the plane of the gate conductive layer are coated with insulating elements in the plane of the gate conductive layer.

In one embodiment, the second conductive layer is made of titanium.

In one embodiment, the insulating elements are made of titanium oxide.

In one embodiment, the second conductive layer is made of doped polycrystalline silicon.

In one embodiment, the production of the stack of porous layers comprises the following steps:

the production of a stack of layers that includes a first insulating layer, a second conductive layer and an insulating porous membrane constituting the upper insulating layer; and the etching of the first insulating layer and of the second conductive layer through the porous membrane serving as etching mask.

In one embodiment, the porous membrane is produced by anodic oxidation of an aluminum layer.

In one embodiment, the production of the filaments comprises the deposition of catalytic elements within at least some of the pores followed by vapor growth of single crystals of semiconductor material starting from said elements.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE PREFERRED EMBODIMENT

The present invention provides a method for organizing and placing in parallel a predetermined number of nanowires of silicon semiconductor material or of carbon nanotubes, in order to obtain a transistor structure. In general, the present invention thus opens the way to producing integrated circuits and active matrices for flat display screens based on nanostructures in an industrial manner. The invention thus makes it possible to dispense with sophisticated and extremely expensive lithography means for producing pores with a diameter of the order of 10 nm, or even less, and it also has the advantage of being able to produce this type of vertical transistor structure using a small number of etching steps. In the case of the desired current industrial processes, this represents a major benefit.

In general, in the present invention, the production of the entire porous structure that receives the nanowires or the semiconductor carbon nanotubes (s-CNTs) is based on the synthesis of a heterogeneous membrane comprising notably, as upper layer, a porous layer, for example an anodic alumina layer. Once synthesized, this porous upper layer is used as etching mask so as to extend the porous structure of the membrane to a number of subjacent thin films that will act as source (or drain) and gate electrodes. The nanowires or s-CNTs are then grown using a CVD (chemical vapor deposition) technique starting from particles of catalytic metals (Au in the case of nanowires and Fe, Co, Ni, etc., for s-CNTs) which are deposited beforehand in the bottom of the pores by an electrochemical process.

An example of a process for fabricating a vertical transistor structure according to the invention is described below within the context of an example of silicon nanowires and illustrated in FIGS. 4a to 4h, which show the main steps of said process.

Figure 1:
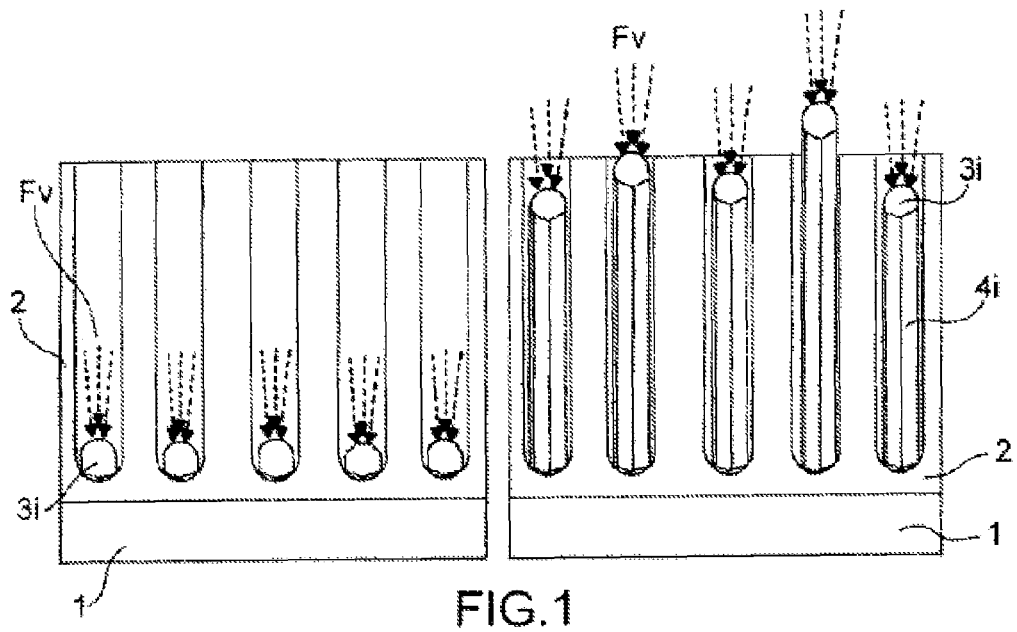
FIG. 1 illustrates a diagram showing the growth of filaments through a porous membrane according to the prior art.
Figure 2:
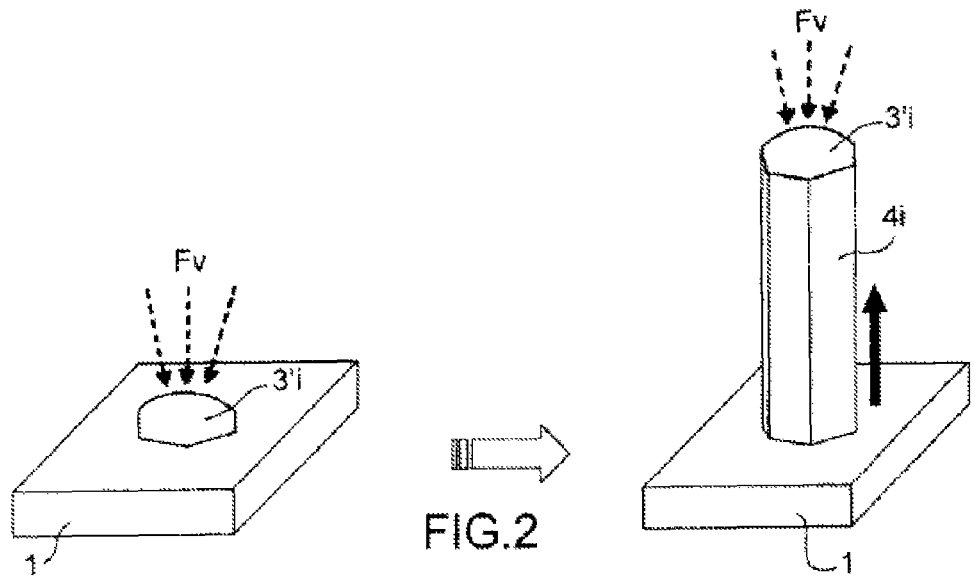
FIG. 2 illustrates a process of the known art for growing filaments.
Figure 3:
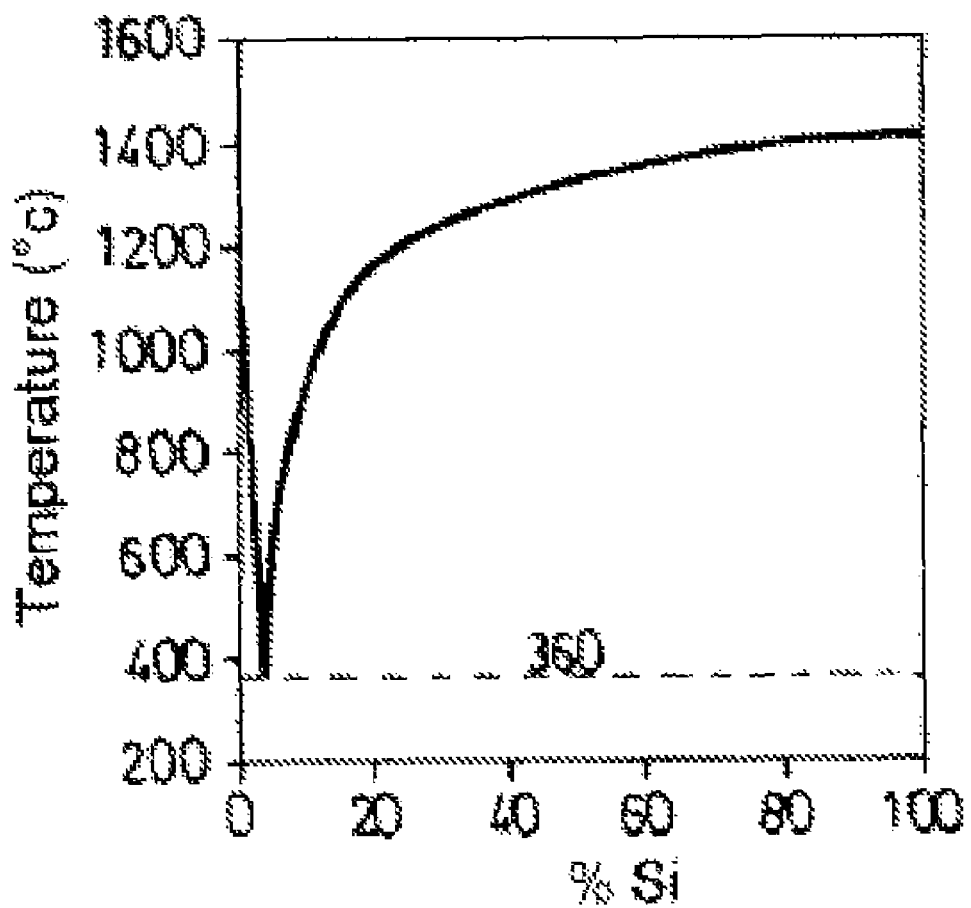
FIG. 3 shows the gold/silicon phase diagram demonstrating the existence of a eutectic.
Figure 4A:
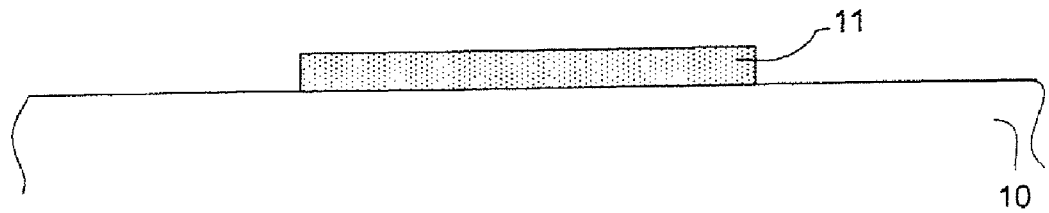
FIGS. 4a to 4h illustrate the various steps prior to the growth of filaments in a vertical transistor structure according to the invention, seen in cross section.

In a first step 1 illustrated in FIG. 4a, a first conductive layer intended to act as source electrode 11 (this may be made of a metal such as molybdenum (Mo) for example) is deposited on an insulating substrate 10 and then etched.

Figure 4B:
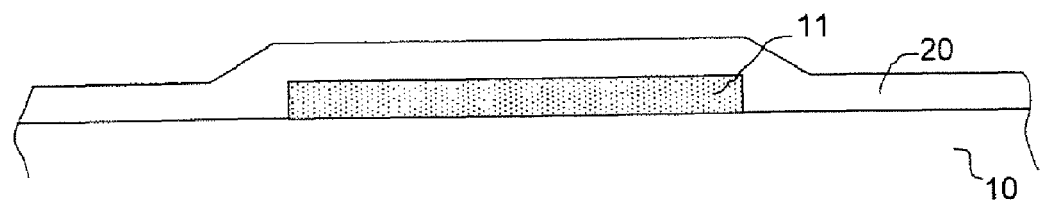

In a second step 2, illustrated in FIG. 4b, a first layer 20 of insulating material such as silica (SiO2) is then deposited on this etched first electrode.

Figure 4C:
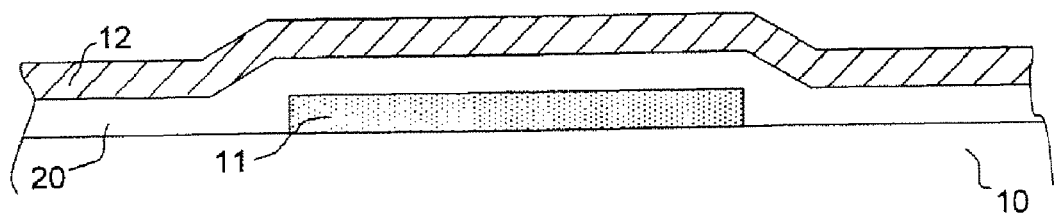

Step 3 illustrated in FIG. 4c consists in depositing a second thin conductive layer 12 of a conductive material that can be easily oxidized on the surface, such a titanium (Ti) or polycrystalline silicon (Si) degenerated by doping. This layer is then etched so as to produce a strip that will be described and illustrated in top view in FIG. 7 and will act as gate electrode.

Figure 4D:
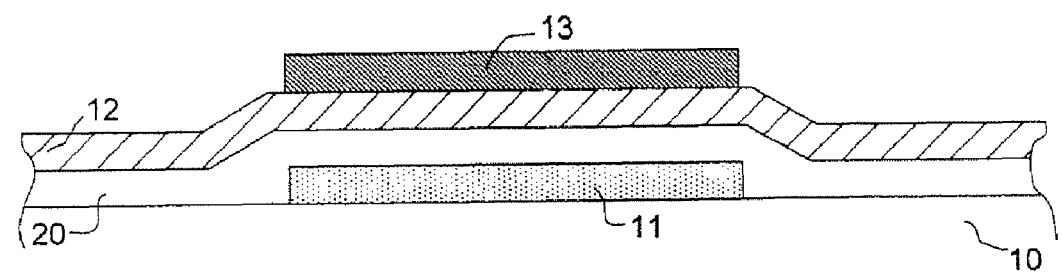

During step 4 illustrated in FIG. 4d, a third thin conductive layer 13, which may typically be made of aluminum, is deposited and etched so as to roughly align it with the first conductive layer 11 and so that it is entirely supported by the second conductive layer 12 made of titanium or degenerated polycrystalline silicon.

Figure 4E:
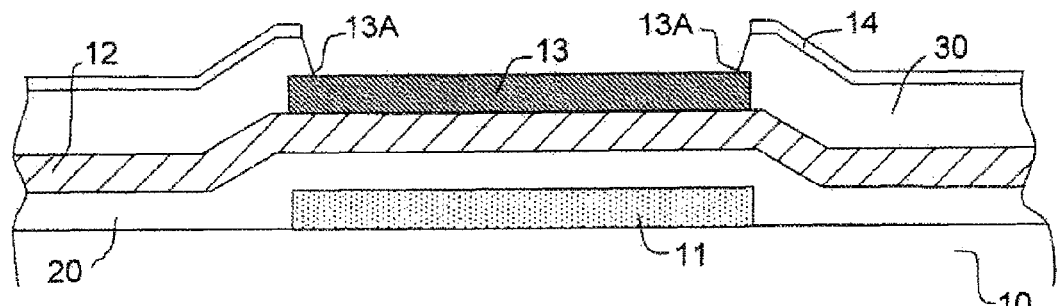

Next, in step 5 illustrated in FIG. 4e, a third insulating layer 30, for example of silica, and a fourth layer 14 that will subsequently serve as etching mask are successively deposited. This etching mask 14 may for example be a deposit of gold, without this being limiting. The assembly formed by the third insulating layer and the fourth layer is then etched, so as to partly cover the edges of the previously deposited and etched third conductive layer 13 and to define a boundary zone 13A on the layer 13.

Figure 4F:
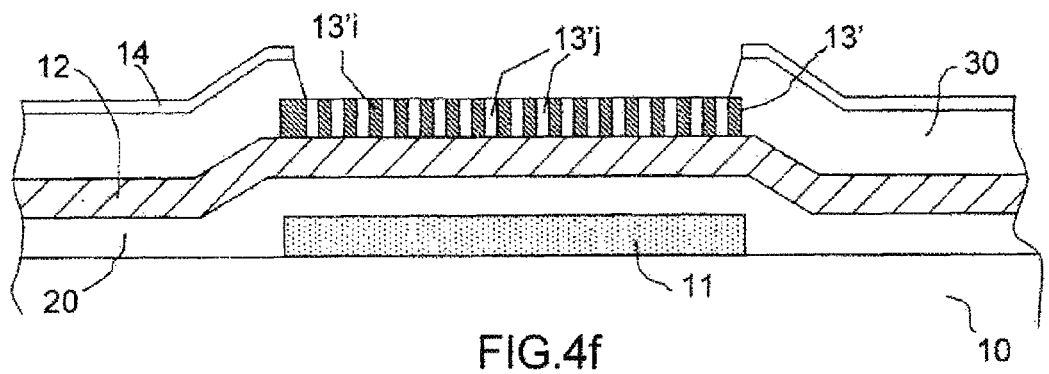

During step 6 illustrated in FIG. 4f, this aluminum third layer 13 is anodically oxidized using the subjacent titanium or polycrystalline silicon layer 12 as electrode. The anodic oxidation of aluminum has been described in the literature (J. P. O'Sullivan and G. C. Wood, Proc. Roy. Soc. Lond., Vol. A317, p. 511, 1970; H. Masuda and K. Fukuda, Science, Vol. 268, p. 1466, 1995).

A porous insulating layer 13' comprising a network of insulating elements 13'i and pores 13'j is thus obtained.

Figure 4G:
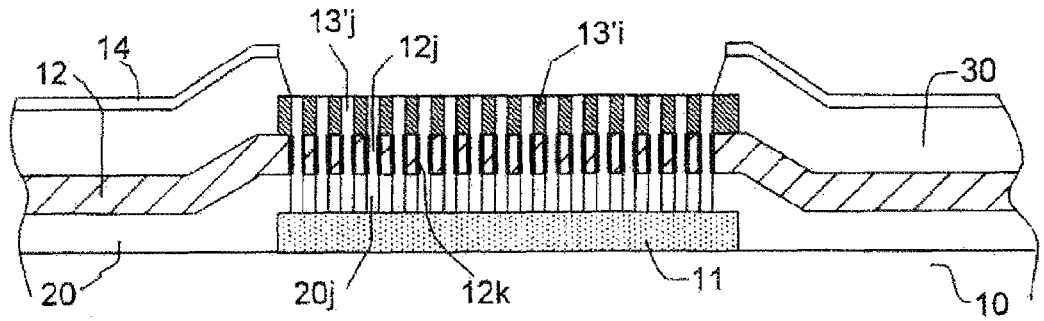

Once the network of pores has been obtained, the anodic alumina membrane 13' is used as RIE (reactive ion etching) mask to etch pores within the second conductive layer 12, defining pores 12j, and also in the first insulating layer 20 subjacent to the second conductive layer defining pores 20j in this insulating layer 20. The pores 20j, 12j and 13'j are thus substantially aligned. The structure obtained is shown in FIG. 4g. After the etching operation has been carried out, the process then continues with a step to remove the masking layer 14 and the sidewalls of the pores 12j are slightly oxidized so as to produce gate oxide elements 12k that will subsequently be used to control the conduction in the channel of the transistors.

Figure 4H:
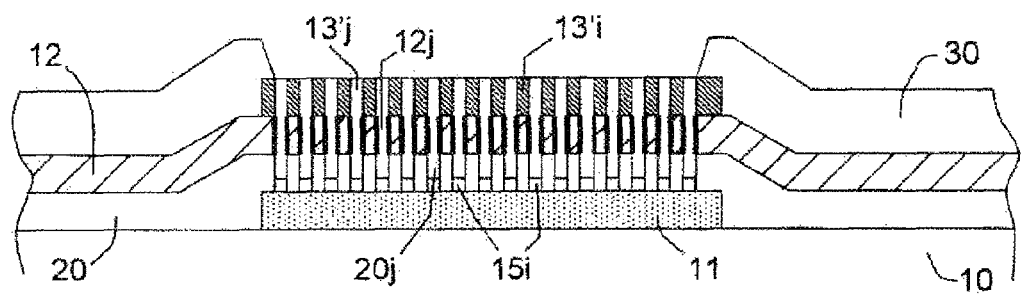

In step 8 illustrated in FIG. 4h, conductive particles 15i, which typically may be gold particles, are deposited by an electrochemical process using the first layer 11 as electrode for the electrodeposition. These elements 15i serve as catalyst for growth of the silicon nanowires using the VLS method described above.

Figure 5A:
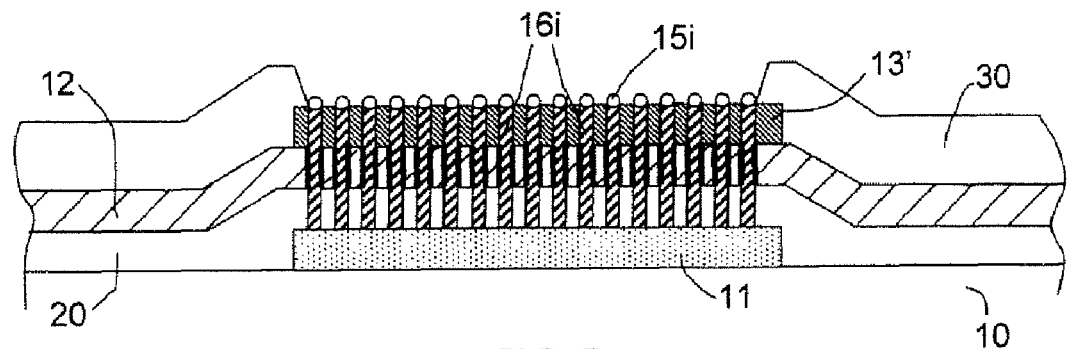
FIGS. 5a and 5b illustrate the steps of growing filaments through a heterogeneous membrane according to the process of the invention, in a structure according to the invention seen in cross section.
Figure 5B:
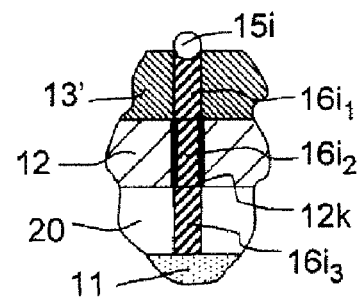

FIG. 5a illustrates the growth of the nanowires 16i starting from the catalytic elements 15i. FIG. 5b shows the detail of a pore after being filled with a silicon nanowire. Advantageously, the growth may be carried out sequentially using, for example, in succession, a silane (SiH4)/dopant gas (PH3 or B2H6) mixture, so as to produce a first contact zone 16i1 (n+-doped or p+-doped, depending on the dopant gas) of the transistor, then pure silane to produce a second contact zone 16i2 (production of the intrinsic channel zone of the transistor) and then, once again, a silane+dopant gas mixture to form a likewise doped third contact zone 16i3. FIG. 5b shows in detail the sidewall oxide 12k of the second conductive layer 12, which oxide serves to isolate said layer from the channel of the transistor, said layer being intended to form the gate control electrode, from the channel of the transistor.

Figure 6:
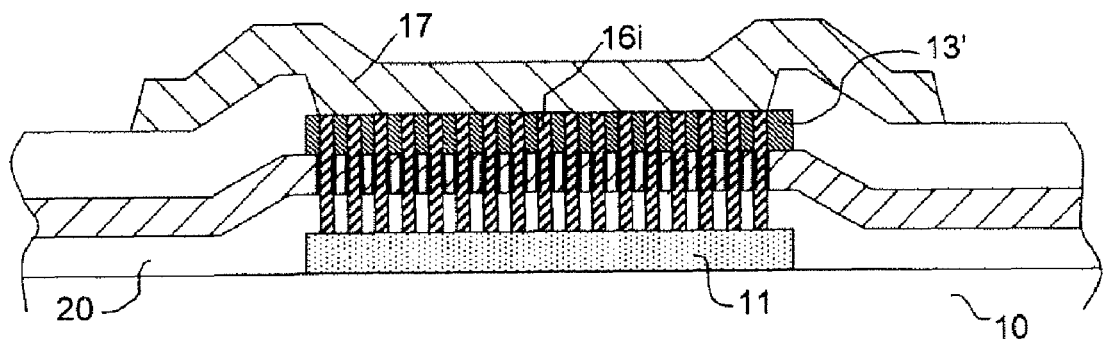
FIG. 6 illustrates the transistor structure according to the invention, which includes the source, gate and drain electrodes.

The vertical transistor structure according to the invention is completed by depositing a final conductive layer 17 intended to act as drain electrode on top of the nanofilaments formed beforehand. This drain electrode is deposited after the catalytic particles have been removed by selective chemical etching. FIG. 6 illustrates the thus complete structure, showing the source, gate and drain electrodes consisting of the first conductive layer 11, the second conductive layer 12 and the last conductive layer 17 respectively. Typically, the source and drain electrodes have thicknesses of the order of a few hundred nanometers. The thickness of the second conductive layer constituting the gate electrode, possibly made of titanium, may have a thickness of the order of several tens of nanometers.

Figure 7:
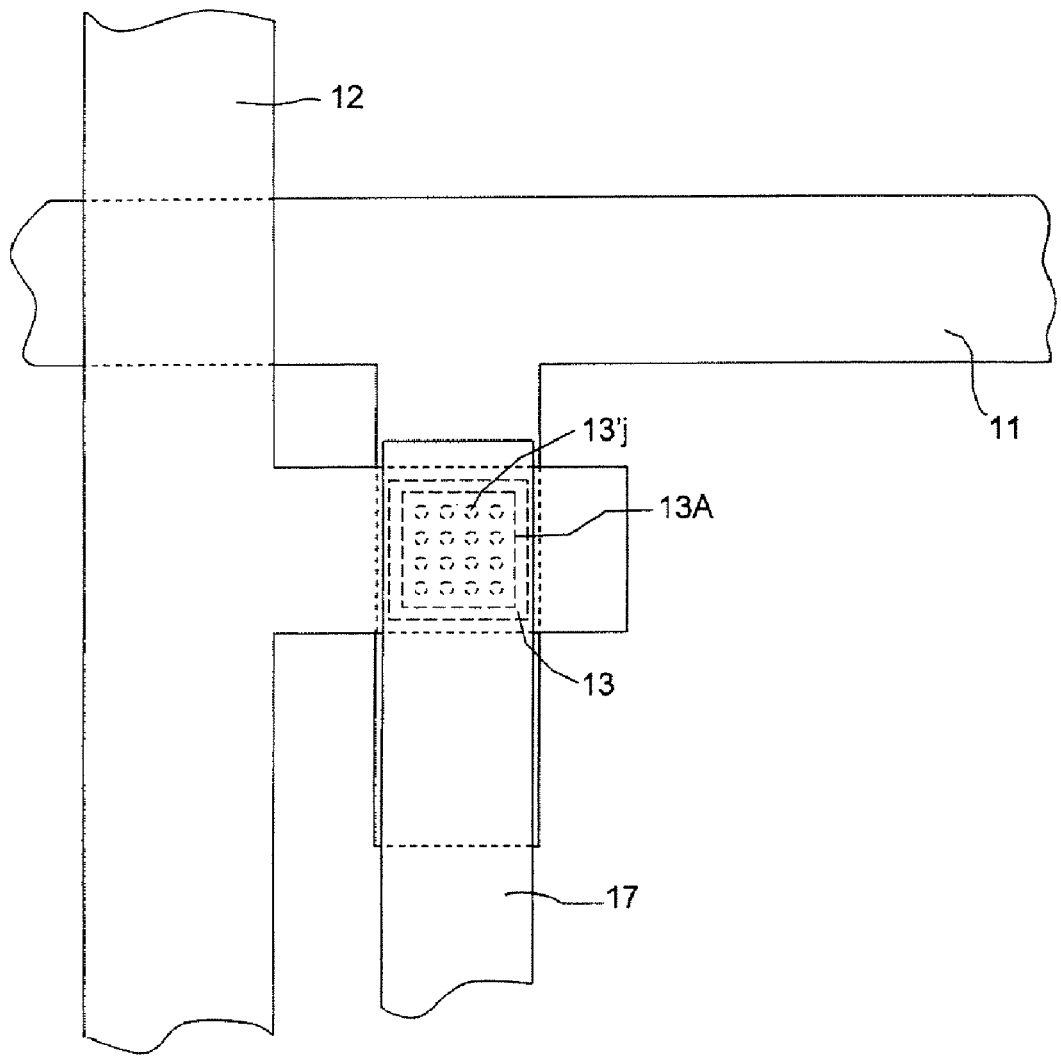
FIG. 7 illustrates a top view of a set of masks formed by etching the constituent conductive layers of the electrodes and produced during the process steps illustrated in the set of FIGS. 4 to 6.

As an illustration, FIG. 7 shows a top view depicting the various conductive layers deposited as source electrode 11, gate electrode 12 and drain electrode 17, and also the zone delimited by the masking step and defined by the edges 13A, in which zone the nanopores 13'j are produced.

If it is desired to fabricate a transistor based on semiconductor carbon nanotubes instead of fabricating a transistor based on silicon, germanium or gallium arsenide, metallic elements made of iron, cobalt or nickel will preferably be deposited as catalytic elements 15i in the nanopores, these materials being well known for catalyzing the growth of carbon nanotubes. In this case, the growth by chemical vapor deposition is carried out using methane (CH4) or acetylene (C2H2) or any other gaseous carbon-containing species.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A process of fabricating a vertical transistor structure of a transistor on a substrate, comprising:
    forming a first conductive layer over the substrate, the first conductive layer being arranged as one of a source or a drain of the vertical transistor structure;
    forming an insulating layer over the first conductive layer;
    forming a second conductive layer over the insulating layer;
    forming a third conductive layer over the second conductive layer;
    converting the third conductive layer into an insulating porous membrane;
    producing a membrane having a stack of porous layers that includes at least the insulating layer, the second conductive layer, and the insulating porous membrane by etching the insulating layer and the second conductive layer using the insulating porous membrane as a mask, said porous layers having substantially stacked pores, and the etched second conductive layer being arranged to form a gate electrode of the transistor;
    performing oxidization on sidewalls of the stacked pores;
    producing filaments inside at least some of the stacked pores of the porous layers; and
    producing an upper conductive layer over the stack of porous layers, the upper conductive layer being arranged as another one of the source or the drain of the vertical transistor structure, and the upper conductive layer and the first conductive layer are connected by the filaments formed inside the at least some of the stacked pores of the porous layers.

2. The process for fabricating a vertical transistor structure as claimed in claim 1, wherein the filaments are made of silicon or germanium or III-V material of the GaAs type.

3. The process for fabricating a vertical transistor structure as claimed in claim 1, wherein the filaments have heterogeneous regions along their height.

4. The process for fabricating a vertical transistor structure as claimed in claim 1, wherein the filaments have a region made of n-doped or p-doped semiconductor material, a region made of intrinsic semiconductor material and a region made of p-doped or n-doped semiconductor material.

5. The process for fabricating a vertical transistor structure as claimed in claim 1, wherein the filaments have regions made of different semiconductor materials.

6. The process for fabricating a vertical transistor structure as claimed in claim 1, wherein the filaments are made of carbon.

7. The process for fabricating a vertical transistor structure as claimed in claim 1 wherein the insulating porous membrane is made of porous alumina.

8. The process for fabricating a vertical transistor structure as claimed in claim 1, wherein the insulating layer is made of silica.

9. The process for fabricating a vertical transistor structure as claimed in claim 1, wherein portions of filaments in a plane of the second conductive layer are surrounded by insulating elements.

10. The process for fabricating a vertical transistor structure as claimed in claim 1, wherein the second conductive layer is made of titanium.

11. The process for fabricating a vertical transistor structure as claimed in claim 10, wherein the insulating elements are made of titanium oxide.

12. The process for fabricating a vertical transistor structure as claimed in claim 1, wherein the second conductive layer is made of doped polycrystalline silicon.

13. The process for fabricating a transistor structure as claimed in claim 1, wherein the third conductive layer is an aluminum layer, and the conversion of the third conductive layer into the insulating porous membrane comprises performing anodic oxidation of the aluminum layer.

14. The process for fabricating a transistor structure as claimed in claim 1, wherein the production of the filaments comprises the deposition of catalytic elements within at least some of the pores followed by vapor growth of single crystals of semiconductor material starting from said catalytic elements.

15. The process for fabricating a transistor structure as claimed in claim 14, wherein the filaments are made of silicon.

16. The process for fabricating a transistor structure as claimed in claim 15, wherein the growth is carried out by a step in the presence of various silane-based gases so as to obtain filaments having doped or undoped regions.

17. The process for fabricating a transistor structure as claimed in claim 6, wherein the filaments are made of carbon and the growth is carried out in the presence of methane or acetylene.

18. The process for fabricating a vertical transistor structure as claimed in claim 2, wherein the filaments of semiconductor material have heterogeneous regions along their height.

19. The process for fabricating a vertical transistor structure as claimed in claim 2, wherein the filaments have a region made of n-doped or p-doped semiconductor material, a region made of intrinsic semiconductor material and a region made of p-doped or n-doped semiconductor material.

* * * * *